United States Patent
Kurata et al.

(10) Patent No.: US 7,618,491 B2
(45) Date of Patent: Nov. 17, 2009

(54) SCINTILLATOR SINGLE CRYSTAL AND PRODUCTION METHOD OF SAME

(75) Inventors: Yasushi Kurata, Hitachinaka (JP);
Naoaki Shimura, Hitachinaka (JP);
Tatsuya Usui, Hitachinaka (JP);
Kazuhisa Kurashige, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 134 days.

(21) Appl. No.: 11/374,434

(22) Filed: Mar. 14, 2006

(65) Prior Publication Data
US 2006/0288926 A1 Dec. 28, 2006

(30) Foreign Application Priority Data
Jun. 10, 2005 (JP) .................... P2005-171300
Sep. 9, 2005 (JP) .................... P2005-262568

(51) Int. Cl.
*C30B 15/00* (2006.01)
*C30B 11/00* (2006.01)

(52) U.S. Cl. ............... 117/13; 117/3; 117/11; 117/906; 117/944

(58) Field of Classification Search ........ 117/3, 117/11, 13, 906, 944
See application file for complete search history.

(56) References Cited

U.S. PATENT DOCUMENTS

| | | | | |
|---|---|---|---|---|
| 4,153,838 A * | 5/1979 | Mayeux | ............ | 250/368 |
| 4,234,792 A * | 11/1980 | DeCou et al. | .......... | 250/370.09 |
| 4,883,956 A * | 11/1989 | Melcher et al. | .......... | 250/269.2 |
| 4,958,080 A * | 9/1990 | Melcher | ................ | 250/483.1 |
| 5,025,151 A * | 6/1991 | Melcher | ................ | 250/269.6 |
| 5,264,154 A * | 11/1993 | Akiyama et al. | ...... | 252/301.4 F |
| 5,660,627 A * | 8/1997 | Manente et al. | .......... | 117/12 |
| 6,210,605 B1 * | 4/2001 | Srivastava et al. | ..... | 252/301.4 R |
| 6,278,832 B1 * | 8/2001 | Zagumennyi et al. | ........ | 385/141 |
| 6,302,959 B2 * | 10/2001 | Srivastava et al. | ............. | 117/81 |
| 6,323,489 B1 * | 11/2001 | McClellan | ............. | 250/361 R |
| 6,624,420 B1 * | 9/2003 | Chai et al. | ............. | 250/361 R |
| 6,921,901 B1 * | 7/2005 | Chai et al. | ............. | 250/361 R |
| 7,151,261 B2 * | 12/2006 | Chai | ........................ | 250/362 |
| 7,166,845 B1 * | 1/2007 | Chai | ..................... | 250/361 R |
| 7,347,956 B2 * | 3/2008 | Fukuda et al. | ........ | 252/301.4 R |
| 2005/0104000 A1 * | 5/2005 | Kindem et al. | ......... | 250/361 R |

(Continued)

FOREIGN PATENT DOCUMENTS

JP 64-006160 A 1/1989

(Continued)

OTHER PUBLICATIONS

Second English Abstract JP 2701577B2 reference from the IDS cited reference on May 5, 2006.*

(Continued)

*Primary Examiner*—Robert M Kunemund
*Assistant Examiner*—G. Nagesh Rao
(74) *Attorney, Agent, or Firm*—Westerman, Hattori, Daniels & Adrian, LLP

(57) ABSTRACT

A scintillator single crystal of a specific cerium-doped silicate compound that contains 0.00005 to 0.1 wt % of one or more types of element selected from the group consisting of elements belonging to group 2 of the periodic table based on the total weight of the single crystal.

4 Claims, 1 Drawing Sheet

U.S. PATENT DOCUMENTS

| | | | |
|---|---|---|---|
| 2005/0161638 A1* | 7/2005 | Fukuda et al. | 252/301.4 R |
| 2005/0253072 A1* | 11/2005 | Chai | 250/361 R |
| 2005/0285041 A1* | 12/2005 | Srivastava et al. | 250/361 R |
| 2006/0011845 A1* | 1/2006 | Chai et al. | 250/361 R |
| 2006/0108565 A1* | 5/2006 | Wakamatsu et al. | 252/301.4 H |
| 2006/0266276 A1* | 11/2006 | Shimura et al. | 117/19 |
| 2006/0266277 A1* | 11/2006 | Usui et al. | 117/19 |
| 2006/0288926 A1* | 12/2006 | Kurata et al. | 117/16 |
| 2007/0246660 A1* | 10/2007 | Tahon et al. | 250/483.1 |
| 2007/0246662 A1* | 10/2007 | Tahon et al. | 250/484.4 |
| 2007/0246663 A1* | 10/2007 | Tahon et al. | 250/484.4 |
| 2007/0272867 A1* | 11/2007 | Tahon et al. | 250/361 R |

FOREIGN PATENT DOCUMENTS

| | | |
|---|---|---|
| JP | 7-78215 B2 | 8/1995 |
| JP | 2701577 B2 | 10/1997 |
| JP | 2852944 B2 | 11/1998 |
| JP | 2001-524163 A | 11/2001 |
| JP | 2003-300795 A | 10/2003 |
| WO | WO9935512 | 7/1999 |

OTHER PUBLICATIONS

English translation of JP 2003-300795 enclosed.*

* cited by examiner

SCINTILLATOR SINGLE CRYSTAL AND PRODUCTION METHOD OF SAME

BACKGROUND OF THE INVENTION

1. Field of the Invention

The present invention relates to a scintillator single crystal and a production method thereof, and more particularly, to a scintillator single crystal used in a single crystal scintillation detector (scintillator) for detecting radiation such as gamma radiation and the like in fields such as radiology, physics, physiology, chemistry, mineralogy, and oil exploration, including medical diagnostic positron CT (PET) scanning, observation of cosmic rays, and exploration for underground resources, and to a production method of such a scintillator single crystal.

2. Related Background Art

Because scintillators that use cerium-doped gadolinium orthosilicate compounds have a short fluorescent decay time and also a large radiation absorption coefficient, they have found applications as radiation detectors for positron CT and the like. The light output of these scintillators is greater than that of BGO scintillators, but only about 20% of the light output of NaI (Tl) scintillators, and further improvement is needed in that area.

Recently, scintillators using single crystals of cerium-doped lutetium orthosilicate, which are generally represented by the formula $LU_{2(1-x)}Ce_{2x}SiO_5$, have been disclosed (Japanese Patent Registration No. 2852944, and U.S. Pat. No. 4,958,080). In addition, scintillators using single crystals of the compound represented by the general formula $Gd_{2-(x+y)}Ln_xCe_ySiO_5$ (wherein Ln represents Lu or a species of rare earth element) have been disclosed (see Japanese Patent Application Laid-open No. 7-78215 and U.S. Pat. No. 5,264,154). It is known that in these scintillators not only is the crystal density increased, but also the light output of cerium-doped orthosilicate single compounds crystals is increased, and the fluorescent decay time can be shortened.

However, in the case of growing or cooling specific cerium-doped silicate single crystals in an atmosphere containing oxygen (e.g., atmosphere having an oxygen concentration of 0.2 vol % or more), or in the case of growing in atmosphere having a low oxygen concentration, and the single crystals are subsequently subjected to high-temperature heat treatment in an atmosphere containing oxygen, this has been clearly shown to lead to a decrease in light output due to coloring of the crystals, absorption of fluorescence and so forth (see Japanese Patent Registration No. 2701577). In addition, when growing cerium-doped silicate single crystals, the Czochralski method is typically used that employs high-frequency heating using an Ir crucible due to the high melting point of the single crystals. However, since Ir crucibles ends up evaporating when heated to a high temperature in an atmosphere containing oxygen, there is the problem of difficulty in achieving stable crystal growth.

Japanese Patent Registration No. 2701577 discloses a heat treatment method that increases scintillator properties such as light output and energy resolution capability and the like of single crystals of cerium-doped gadolinium orthosilicate compounds. This heat treatment method is one wherein a heat treatment is performed in an oxygen-poor atmosphere at a high temperature (a temperature ranging from 50° C. to 550° C. lower than the melting point of the single crystal). According to this document, scintillation properties are increased by an effect wherein tetravalent cerium ions, which are an impediment to scintillation luminescence, are reduced to a trivalent state.

Japanese Patent Application Laid-Open No. 2001-524163 discloses silicate crystal-based scintillation materials containing Lu and Ce, which include oxygen vacancies □ and are represented by the following general formula (8):

$$Lu_{1-y}Me_yA_{1-x}Ce_xSiO_{5-z}\square_z \qquad (8)$$

(wherein, A represents at least one element selected from the group consisting of Lu, Gd, Sc, Y, La, Pr, Nd, Sm, Eu, Tb, Dy, Ho, Er, Tm and Yb, Me represents at least one element selected from the group consisting of H Li, Be, B, C, N, Na, Mg, Al, P, S, Cl, K, Ca, Ti, V, Cr, Mn, Fe, Co, Ni, Cu, Zn, Ga, Ge, As, Se, Rb, Sr, Zr, Nb, Mo, Ru, Rh, Pd, Ag, Cd, In, Sn, Sb, Cs, Ba, Hf, Ta, W, Re, Os, Ir, Pt, Au, Hg, Tl, Pb, Bi, U and Th.)

This document describes fifty and more elements (ions) from H to Th as Me substitute for Lu. The document describes that introduction of these elements prevents cracking of crystals during cutting and manufacturing scintillation elements and creates waveguide properties in waveguide elements. The document also describes that existence in a scintillation material or addition into the material of a necessary quantity of ions having the oxidation of +4, +5 and +6 (for example, Zr, Sn, Hf, As, V, Nb, Sb, Ta, Mo, W, W) allows to prevent cracking of crystals and forming of vacancies in oxygen sub-lattices.

Japanese Patent Publication No. S64-6160 discloses that a method for heating single crystals of tungsten acid compound in an oxgen-containing atmosphere in the range of temperature as follows;

$$(Tmp-200) \leq T < Tmp$$

(wherein T is heating temperature, Tmp is the melting point of the crystal)

as a heating treatment for increasing light output of an oxide scintillator. This document describes that although the crystal is easy to create oxygen vacancies, the light output of the tungsten single crystal increases by heating the crystal near the melting point in the oxygen-containing atmosphere to decrease oxygen vacancies in the crystal.

Japanese Patent Application Laid-Open No. 2003-300795 discloses a single crystal of $Gd_{(2-x)}Ce_xMe_ySiO_5$ (wherein x is 0.003 to 0.05, y is 0.00005 to 0.005, Me is an element selected from a group consisting of Mg, Ta and Zr or their mixture). The document discloses that the elements represented by Me prevent Ce ions from changing their valencies from 3+ to 4+ to obtain an achromatic and highly transparent single crystal.

SUMMARY OF THE INVENTION

However, the single crystals of cerium-doped orthosilicate compounds disclosed in the above document tend to have a high light output background. This results in problems such as variation in fluorescent properties both within and between crystal ingots; in other words, day-to-day variations and time-course changes due to exposure to natural light, including ultraviolet light, occur frequently, and it is very difficult to obtain stable light output properties.

In addition, when the single crystals of those cerium-doped silicate compounds represented by the following general formula (1):

$$Y_{2-(x+y)}Ln_xCe_ySiO_5 \qquad (1)$$

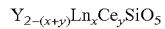

(wherein, Ln represents at least one type of element selected from the group consisting of elements belonging to the rare earth elements, x represents a numerical value of 0 to 2, and y represents a numerical value of greater than 0 but less than or equal to 0.2), the following general formula (2):

$$Gd_{2-(z+w)}Ln_zCe_wSiO_5 \qquad (2)$$

(wherein, Ln represents at least one type of element selected from the group consisting of elements belonging to the rare earth elements, z represents a numerical value of greater than 0 but less than or equal to 2, and w represents a numerical value of greater than 0 but less than or equal to 0.2), or the following general formula (4):

$$Gd_{2-(r+s)}Lu_rCe_sSiO_5 \qquad (4)$$

(wherein, r represents a numerical value of greater than 0 but less than or equal to 2, and s represents a numerical value of greater than 0 but less than or equal to 0.2) are grown or cooled in a neutral or reducing atmosphere having a low level of oxygen or in a vacuum, or are heated at a high temperature in a neutral or reducing atmosphere having a low level of oxygen or in a vacuum after having grown single crystals, it was determined that the background of the light output increases, and decreases in light output and variations in fluorescent properties increase. This trend is particularly prominent in the case of single crystals using as Ln at least one type of element selected from the group consisting of Dy, Ho, Er, Tm, Yb, Lu, Y and Sc having an ionic radius smaller than that of Tb (single crystals of cerium-doped silicate compounds represented with general formula (3) to be described later).

Moreover, satisfactory results can be obtained with the heat treatment method disclosed in Japanese Patent Registration No. 2701577 when it is used on a single crystal of $Gd_{2(1-x)}Ce_{2x}SiO_5$ (cerium-doped gadolinium orthosilicate). However, when this heat treatment is used with single crystals of the cerium-doped silicate compounds represented by general formula (1) above or with single crystals of the cerium-doped gadolinium silicates compounds represented by general formulas (2) and (4) above, the light output background increases. As a result, it has been learned that this heat treatment results in negative effects of a greater drop-off in light output and greater variation in light output. This tendency becomes particularly pronounced with a single crystal having as Ln at least one elemental species selected from a group consisting of Dy, Ho, Er, Tm, Yb, Lu, Y and Sc, which have an ionic radius smaller than Tb.

In addition, the inventors of the present invention found that silicate single crystals containing Lu and Ce represented by the above-mentioned general formula (8) in Japanese Unexamined International Patent Application Laid-open No. 2001-524163 are particularly susceptible to the formation of oxygen deficits (equivalent to oxygen lattice defects) as a result of being orthosilicate compound single crystals containing Lu. Moreover, orthosilicate compound single crystals in which the rare earth element other than Lu is Dy, Ho, Er, Tm, Yb, Lu, Y or Sc, which has a smaller ionic radius than Tb, were found to be more susceptible to the formation of oxygen deficits than orthosilicate compound single crystals using Tb or a rare earth element having an ionic radius larger than Tb. It was further found that the addition of a specific element to that system is able to reduce the effects of the oxygen deficits without causing an increase in crystal cracking.

Moreover, the inventors of the present invention found that an element effective in reducing oxygen deficits of rare earth silicate single crystals is not necessarily adequately effective in reducing oxygen deficits even if it is a tetravalent, pentavalent or hexavalent element described in Japanese Patent Application Laid-open No. 2001-524163. On the contrary, crystal ingots containing these elements were found to exhibit increased cracking. In addition, it is described in this publication that at least 50 elements from H to Th in the periodic table are effective in preventing crystal cracking during cutting or production of scintillation devices, and that they are effective in creating waveguide properties in waveguide devices. However, many of these elements were found to not have the effect of reducing the effects of oxygen deficits.

The inventors of the present invention found that the effects of oxygen deficits on orthosilicate compound single crystals can be more effectively reduced by adding a specific element to a single crystal of a specific cerium-doped silicate compound represented by the above-mentioned general formula (1), (2) or (4). This specific element is an element belonging to group 2 of the periodic table (group IIa) (to be simply referred to as a "group 2 element") that is able to exist as a stable oxide at a high temperature in the vicinity of the melting point equivalent to conditions during the above-mentioned single crystal growth, and in an environment of a neutral or reducing atmosphere such as an argon atmosphere or a nitrogen atmosphere. In addition, when such a group 2 element is added to the specific single crystal, changes in the valence of Ce ions can be inhibited even in atmospheres containing trace amounts of oxygen. Consequently, it was determined that the formation of oxygen deficits can be further reduced by adjusting the atmosphere of heat treatment either during or after growth of the single crystals.

In addition, when cerium-doped silicate single crystals are heated at a temperature equal to or higher than a temperature 200° C. lower than melting point of the single crystals as described in Japanese Patent Publication No. S64-6160, light output ends up decreasing due to coloring of the crystals, absorption of fluorescence and so forth as disclosed in Japanese Patent Registration No. 2701577. Accordingly, a temperature of 1000° C. or lower, which is more than 200° C. lower than the melting point of cerium-doped silicate single crystals, is unsuitable in terms of practical use for the heat treatment temperature in an oxygen-containing atmosphere for these single crystals.

Japanese Patent Application Laid-Open No. 2003-300795 relates to a single crystal having a composition that differs from the composition represented by the above-mentioned general formula (1), (2) or (4), and there is no mention whatsoever of oxygen deficits or background.

Therefore, with the foregoing in view, an object of the present invention is to provide a scintillator single crystal having superior fluorescent properties of a cerium-doped silicate compound having for its basic composition a composition represented by the above-mentioned general formula (1), (2) or (4), and particularly a single crystal that uses as Ln at least one element selected from group consisting of Dy, Ho, Er, Tm, Yb, Lu, Y and Sc having a smaller ionic radius than Tb, and a production method thereof.

The present invention provides a scintillator single crystal of a cerium-doped silicate compound represented by the following general formula (1) or (2) that contains 0.00005 to 0.1 wt % of one or more types of element selected from the group consisting of elements belonging to group 2 of the periodic table based on the total weight of the single crystal:

$$Y_{2-(x+y)}Ln_xCe_ySiO_5 \qquad (1)$$

(wherein, Ln represents at least one type of element selected from the group consisting of elements belonging to the rare earth elements, x represents a numerical value of 0 to 2, and y represents a numerical value of greater than 0 but less than or equal to 0.2);

$$Gd_{2-(z+w)}Ln_zCe_wSiO_5 \quad (2)$$

(wherein, Ln represents at least one type of element selected from the group consisting of elements belonging to the rare earth elements, z represents a numerical value of greater than 0 but less than or equal to 2, and w represents a numerical value of greater than 0 but less than or equal to 0.2).

The present invention provides a scintillator single crystal of a cerium-doped silicate compound represented by the following general formula (3) that contains 0.00005 to 0.1 wt % of one or more types of element selected from the group consisting of elements belonging to group 2 of the periodic table based on the total weight of the single crystal:

$$Gd_{2-(p+q)}Ln_pCe_qSiO_5 \quad (3)$$

(wherein, Ln represents at least one type of element selected from the group consisting of the rare earth elements of Dy, Ho, Er, Tm, Yb, Lu, Y and Sc having a smaller ionic radius than Tb, p represents a numerical value of greater than 0 but less than or equal to 2, and q represents a numerical value of greater than 0 but less than or equal to 0.2).

The present invention provides a scintillator single crystal of a cerium-doped silicate compound represented by the following general formula (4) that contains 0.00005 to 0.1 wt % of one or more types of element selected from the group consisting of elements belonging to group 2 of the periodic table based on the total weight of the single crystal:

$$Gd_{2-(r+s)}Lu_rCe_sSiO_5 \quad (4)$$

(wherein, r represents a numerical value of greater than 0 but less than or equal to 2, and s represents a numerical value of greater than 0 but less than or equal to 0.2).

The present invention provides the scintillator single crystal as described above, wherein one or more types of the element selected from the group consisting of elements belonging to group 2 of the periodic table is one or more types of elements selected from the group consisting of Ca and Mg.

The present invention provides a method for producing the above-mentioned scintillator single crystal having a step wherein a raw material is prepared that contains one or more types of an element selected from the group consisting of elements belonging to group 2 of the periodic table as a constituent element.

According to the present invention, a scintillator single crystal of a cerium-doped silicate compound is able to provided having for its base composition a composition represented by the above-mentioned general formula (1), (2) or (4), and particularly a scintillator single crystal that uses as Ln at least one type of element selected from the group consisting of Dy, Ho, Er, Tm, Yb, Lu, Y and Sc having an ionic radius smaller than Tb, said scintillator single crystal having superior fluorescent properties, as well as a production process thereof.

DESCRIPTION OF THE PREFERRED EMBODIMENTS

Figure 1:
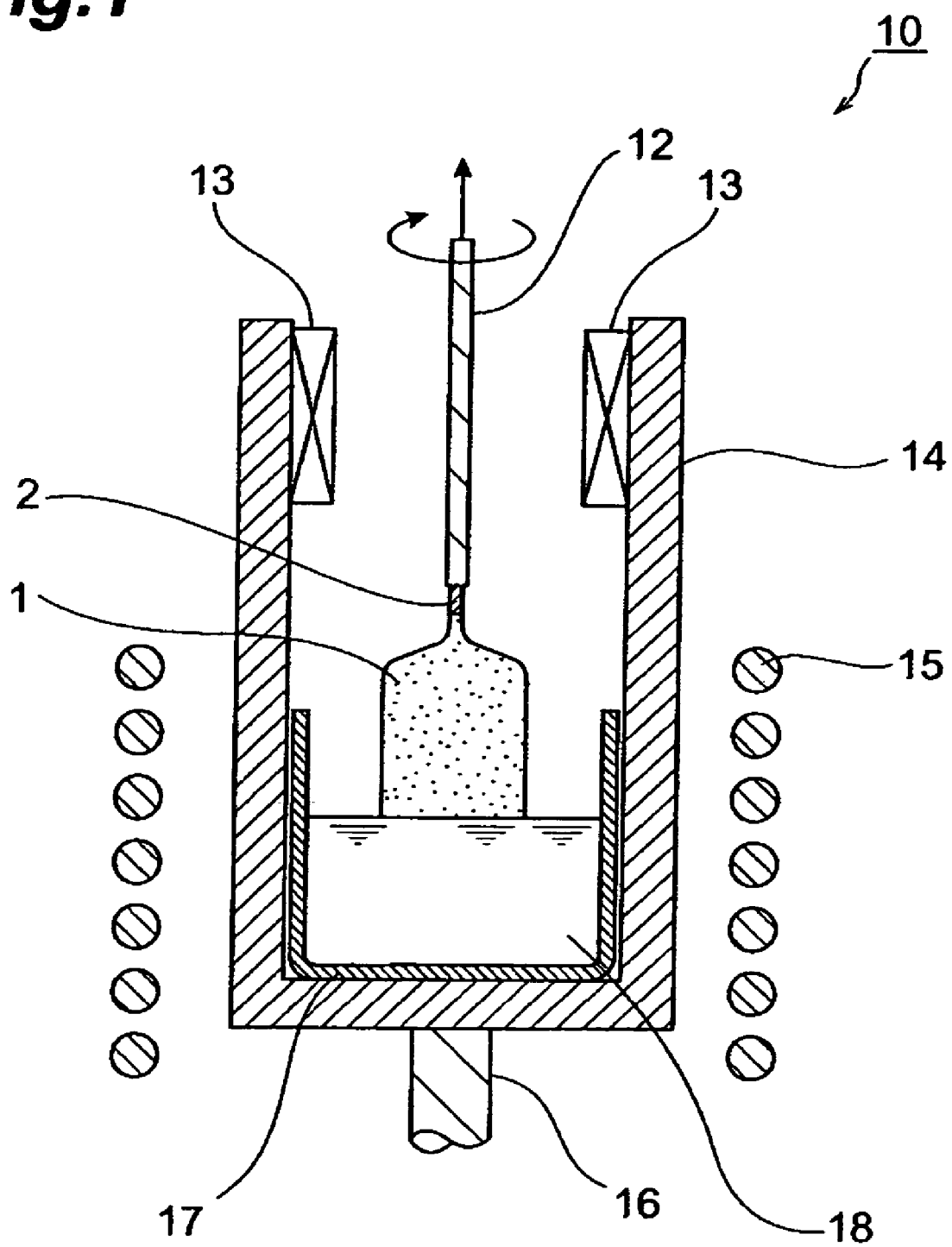
FIG. 1 is a typical cross-sectional view illustrating one example of the basic structure of a growing apparatus for growing a single crystal.

Hereinafter a detailed description of the preferred embodiments of the present invention is provided, but the present invention is by no means limited to the scope presented below.

When single crystals of cerium-doped rare earth orthosilicate compounds are grown or heat-treated in an oxygen-containing atmosphere, trivalent cerium ions, which constitute the luminescent center, are converted to their tetravalent form. It is known that this change causes a reduction in the luminescent center and an increase in fluorescent absorption due to coloration of the crystal, which results in a decrease in light output. This phenomenon tends to be more pronounced as the oxygen concentration in the atmosphere increases and as the heating temperature increases.

In single crystals of specific cerium-doped rare earth orthosilicate compounds the trivalent state of the cerium ions is retained by growing and cooling the crystal in an oxygen-poor neutral or reducing atmosphere or vacuum or by heating it in an oxygen-poor neutral or reducing atmosphere or vacuum. It is believed that a high light output is obtained because the coloration of the crystal is sufficiently inhibited thereby, and absorption of fluorescence due to coloration is sufficiently inhibited. In addition, when single crystals of cerium-doped rare earth orthosilicate compounds are grown and cooled in an atmosphere that contains oxygen, or heated in an oxygen-containing atmosphere, the light output decreases. However, if a heat treatment is subsequently performed in an oxygen-poor atmosphere, the tetravalent cerium ions in the single crystal revert to the trivalent state, which leads to an increase in the luminescent center and decrease in crystal coloration. It is known that the light output is increased thereby because optical transmittance in the crystal is increased. This phenomenon tends to be more pronounced as the oxygen concentration in the atmosphere decreases and also as the concentration in the atmosphere of a reducing gas such as hydrogen and the like increases, or as the heating temperature increases.

In fact, it has been confirmed that good fluorescence properties and an improving effect in fluorescent properties are obtained by the aforementioned crystal growth in an oxygen-poor atmosphere and heat treatment at a high temperature in single crystals of $Gd_{2(1-x)}Ce_{2x}SiO_5$ (cerium-doped gadolinium orthosilicate) and the like. For example, as a single crystal heat treatment method for cerium-doped gadolinium orthosilicate compounds Japanese Patent Registration No. 2701577 discloses a method wherein heat treatment is performed in an oxygen-poor atmosphere at a high temperature (a temperature 50° C. to 550° C. lower than the single crystal melting point).

However, it has become clear that with single crystals of the cerium-doped silicate compounds represented by general formula (1) above and single crystals of the cerium-doped gadolinium orthosilicate compounds represented by general formulas (2) and (4) above, the light output background is increased by growing and cooling the single crystals in the aforementioned oxygen-poor neutral or reducing atmosphere or vacuum or by performing a heat treatment in an oxygen-poor neutral or reducing atmosphere or vacuum. It has also become clear that the negative effect of greater variation in fluorescent properties results thereby. This tendency is especially pronounced when a single crystal of at least one elemental species selected from a group consisting of Dy, Ho, Er, Tm, Yb, Lu, Y and Sc, which have an ionic radius smaller than Tb, is used as Ln. Moreover, this effect tends to become more pronounced as the oxygen concentration in the atmosphere decreases and as the concentration of a reducing gas such as hydrogen and the like in the atmosphere increases, and as the heating temperature increases.

One possible cause is believed to be that in the aforementioned single crystals an oxygen deficiency is created within the crystal lattice by growing or heat-treating the single crystal in an oxygen-poor atmosphere. It is also believed that an energy trap level is formed by this oxygen deficiency, the light output background, which is attributable to a thermal excitation effect originating therefrom increases, and as a result variation in light output increases.

BRIEF DESCRIPTION OF THE DRAWINGS

Oxygen deficits in the single crystal of the cerium-doped orthosilicate compound tend to be reduced if the single crystal is grown in an atmosphere having a high oxygen content. However, since the valence of the cerium ion changes from trivalent ($Ce^{3+}$) to tetravalent ($Ce^{4+}$) as a result of growing the single crystal in an atmosphere having a high oxygen content, the transmission factor at the emission wavelength decreases leading to a decrease in light output. In addition, many of these orthosilicate single crystals have an extremely high melting point of 1600° C. or higher. Single crystals of orthosilicates are typically grown according to the Czochralski method by high-frequency heating using an Ir crucible. However, when an Ir crucible is exposed to an oxygen-containing atmosphere at a high temperature of 1500° C. or higher, evaporation of Ir becomes prominent resulting in the problem of increased likelihood of hindering crystal growth. Due to these two problems, cerium-doped orthosilicate single crystals are frequently grown in a neutral or reducing atmosphere having a low oxygen content. As a result, there is the problem of increased susceptibility to the formation of oxygen deficits in the crystal growth stage of the crystals.

In cerium-doped othosilicates this oxygen deficit defect tends to occur often in crystal compositions wherein the crystal structure often assumes a C2/c configuration. In the single crystals of the cerium-doped silicate compound represented by general formula (1) above and single crystals of the cerium-doped gadolinium silicate compounds represented by general formulas (2) and (4) above, the crystal structure assumes a $P2_1/c$ configuration when at least one elemental species selected from a group consisting of La, Pr, Nd, Pm, Sm, Eu, Ga, and Tb, which are elements having an ionic radius larger than Dy, is selected as Ln. On the other hand, when at least one elemental species selected from a group consisting of Dy, Ho, Er, Tm, Yb, Lu, Y and Sc, which have an ionic radius smaller than Tb, is selected as Ln, the crystal structure readily assumes a C2/c configuration. The aforementioned increase in the light output background and variation in light output often occur in single crystals in which the crystal structure readily assumes a C2/c configuration. It is believed this phenomenon is attributable to the fact that the aforementioned oxygen deficit occurs more frequently as the difference between the ionic radius of the cerium dopant and that of the aforementioned elements that constitute the orthosilicate compound increases.

In fact, in the case of single crystals of the cerium-doped gadolinium silicate compound represented by general formula (3) above, it has been found that the oxygen deficiency tends to occur more often as the ratio of Ln, which has the smaller ionic radius, increases in the composition. In single crystals of cerium-doped orthosilicate compounds wherein an oxygen deficiency often occurs due to the aforementioned crystal composition, it is believed that the oxygen deficiency occurs more or less often depending on whether heating is performed in a neutral atmosphere or an atmosphere containing a trace amount of oxygen, or whether heating is performed at an even lower temperature.

Furthermore, in single crystals of $Lu_{2(1-x)}Ce_{2x}SiO_5$ (cerium-doped lutetium orthosilicate wherein the crystal structure has a C2/c configuration) it is believed that an oxygen deficiency frequently occurs because there is a large difference in ionic radius between the Lu ions and Ce ions.

In single crystals of the aforementioned cerium-doped orthosilicate compounds, when crystal growth is performed by the Czochralski method, the segregation coefficient of the cerium incorporated into the crystal from the crystal melt becomes markedly smaller as the difference increases between the ionic radius of the structural rare earth element and the ionic radius of cerium. Therefore, it is believed that the variation in crystal light output and background may be caused by the fact that variations in the cerium concentration within the crystal ingot often occur.

With respect to the Ce concentration in the scintillator single crystal of the present invention, in the above-mentioned general formulas (1), (2), (3) and (4), y, w, q and s are preferably a value of greater than 0 but less than or equal to 0.2, more preferably 0.0001 to 0.02, and most preferably 0.0005 to 0.005. In the case this value is 0, since this means that the activator in the form of Ce is not present, fluorescent light is no longer able to be obtained since an emission level is not formed. In addition, if this value is greater than 0.2, the amount of Ce incorporated in the crystal becomes saturated, and the effect of Ce addition is diminished. Moreover, voids and defects caused by segregation of Ce occur which tend to cause deterioration of fluorescent properties.

The inventors of the present invention examined additives that have the effect of improving light output by inhibiting deterioration of light output caused by the formation of oxygen deficits. As a result, it was found that an element belonging to group 2 of the periodic table (to be simply referred to as a "group 2 element") is effective for this purpose. Among these, it was determined that one or more types of element selected from the group consisting of Mg and Ca having an ionic radius approximating that of rare earth elements in the above-mentioned general formulas (1), (2), (3) and (4) is particularly effective.

The inventors of the present invention examined additives that have the effect of improving light output by inhibiting deterioration of light output caused by the formation of oxygen deficits. As a result, it was found that an element that is able to exist as a stable oxide under the temperature conditions and in the atmosphere during crystal growth is effective for this purpose. Therefore, elementary M (M-N-O-based) diagrams were calculated using software for calculating chemical reactions and equilibrium states (trade name: "HSC Chemistry for Wmdows (registered trademark): Chemical Reaction and Equilibrium Software with Extensive Thermochemical Database", Outokumpu Co., Ltd.) for the elementary oxidation states in the vicinity of the single crystal growth conditions of orthosilicate compounds. A critical oxygen partial pressure value that allows an element to exist as a stable oxide without being reduced in a nitrogen atmosphere at a pressure of 1 atmosphere and a temperature of 2000° C. in the vicinity of the melting temperature of orthosilicate compound single crystals as derived by this computational software is believed to correspond to the ease at which the element is able to exist as an oxide under crystal growth conditions. Namely, an element is thought to be able to more easily exist as an oxide under the above-mentioned crystal growth conditions the greater the negativity of the value of ΔG in an oxidation reaction represented by the following general formula (9) under the crystal growth conditions:

$$M + xO_2 \rightarrow MO_{2x} \quad (9)$$

(wherein, M represents an element and x represents a coefficient).

As a result of calculations using the above-mentioned computational software, one or more types of elements able to exist as an oxide in the vicinity of an oxygen partial pressure of $1 \times 10^{-14}$ atmospheres in a nitrogen atmosphere at a temperature of 2000° C. and pressure of 1 atmosphere can be preferably used in the present invention.

Examples of elements able to exist as a stable oxide up to a range of oxygen partial pressure of $1 \times 10^{-12}$ to $1 \times 10^{-14}$ atmospheres in a nitrogen atmosphere at a temperature of 2000° C. and pressure of 1 atmosphere, other than rare earth elements, include Ra, Zr, Hf, Mo, Al, Be, Mg, Ca, Sr, Ba, Ga, Ta, Li and Sc. Moreover, examples of elements able to exist as stable oxides at an oxygen partial pressure lower than $1 \times 10^{-14}$ atmospheres, other than rare earth elements, include Be, Mg, Ca, Sr and Ba belonging to group 2 (group IIa) of the periodic table. These elements able to exist as oxides down to an ultra-low oxygen partial pressure at high temperature in the vicinity of 2000° C. are elements that easily react with oxygen. Consequently, together with inhibiting the desorption of oxygen ions from single crystals by bonding with oxygen in the single crystals, oxygen is presumed to be incorporated in the single crystals as a result of these elements bonding with trace amounts of residual oxygen in the growth atmosphere. As a result, even in the case the orthosilicate compound single crystal is exposed to an atmosphere at a high temperature and having a low oxygen concentration, the formation of oxygen deficits is thought to be able to be inhibited. In addition, the transition of Ce ions from trivalent to tetravalent ions is thought to be inhibited as a result of group 2 elements hindering the reaction between oxygen and Ce ions. Thus, even if a trace amount of oxygen is mixed into the atmosphere during heat treatment during or after single crystal growth, it is difficult for a change in the valence of the Ce ions to occur. As a result, it is possible to reduce the formation of oxygen deficits in the single crystals by adjusting the oxygen concentration in the atmosphere. However, the causative relationship of the effects of group 2 elements in the present invention is not limited to the action described above.

The concentration of the group 2 element in the orthosilicate single crystal as claimed in the present invention is preferably 0.00005 to 0.1 wt %, more preferably 0.0001 to 0.05 wt %, and most preferably 0.0005 to 0.01 wt % based on the total weight of the crystal. If the concentration is less than 0.00005 wt %, it becomes difficult to obtain the effect of adding the group 2 element. If the concentration is greater than 0.1 wt %, lattice defects and crystal strain increase due to the addition of the group 2 element, which tends to make crystal growth difficult due to increases in polycrystals and cracking. In addition, light output also tends to decrease due to the formation of non-emission levels caused by lattice defects.

A production process for a scintillator single crystal as claimed in the present invention may comply with ordinary methods for producing orthosilicate compound single crystals with the exception of using a raw material in which a group 2 element is contained as a constituent element. When preparing the single crystal raw material, it is preferable to add the group 2 element to the raw material at 0.0002 to 0.1 wt %. The added group 2 element is incorporated in the orthosilicate compound single crystal as claimed in the present invention based on the dispersion coefficient (segregation coefficient) into the crystal from the raw material melt. This dispersion coefficient is thought to be affected by the difference in ionic radius between the rare earth element in the base crystal of the single crystal and the added group 2 element. Since this dispersion coefficient is less than 1, the concentration of the group 2 element present in the single crystal tends to be smaller than the amount added in the raw material.

In addition, the ionic radius of the group 2 element present in the orthosilicate compound single crystal is thought to have an effect on the oxygen deficit reducing effect. Furthermore, the ionic radius to be described later is the empirical ionic radius according to Shannon and Prewitt (1969, 1970) cited from the web site of the Earth Resources Research Laboratory of Hiroshima University (http://home.hiroshima-u.ac.jp/er/Min_G2.html, as of Jun. 8, 2005). A portion of that data also uses the estimated values of Shannon (1976), Pauling (1960) or Ahrens (1952).

The group 2 element in the orthosilicate compound single crystal as claimed in the present invention is thought to exist at the location of a rare earth element such as Lu or Gd or at an interstitial location. In the case of a group 2 element present as a result of being substituted for a rare earth element such as Lu, Y or Gd or at the crystal lattice location of Si in particular, an element having an ionic radius that is closer to the ionic radius of an element in the base crystal (40 pm for Si, 98 pm for Lu, 102 pm for Y and 105 pm for Gd) is more easily substituted at the lattice location of a rare earth element. Accordingly, the use of such a group 2 element is thought to be considerable effective in improving light output Furthermore, 1 pm=0.01 Å.

The group 2 elements of Be (ionic radius: 35 pm), Mg (ionic radius: 72 pm), Ca (ionic radius: 112 pm), Sr (ionic radius: 125 pm), Ba (ionic radius: 142 pm) and Ra (ionic radius: 148 pm) have gradually increasing ion radii in that order. Among these, when Mg and/or Ca, having an ionic radius that is close to that of Lu, Gd or Y of the base crystal, is added to the base crystal, the effect of improving light outputput of the present invention can be demonstrated more effectively. When Ca having an ionic radius closest to Lu, Gd or Y is added to the base crystal in particular, it is easily incorporated into the crystal, and the effect of improving light output of the present invention can be demonstrated extremely effectively.

On the other hand, the tetravalent, pentavalent and hexavalent elements described in Japanese Patent Application Laid-open No. 2001-524163 as elements which, when added, have the effect of reducing oxygen deficits of rare earth silicate single crystals have difficulty in existing as a stable oxide in a high-temperature growth atmosphere having a low oxygen content as previously described. Thus, in comparison with group 2 elements, these elements are only able to exist as oxides in environments having higher partial oxygen pressures. As a result, it was found by the inventors of the present invention that these elements are unable to adequately demonstrate the effects of reducing oxygen deficits and inhibiting changes in valence of Ce ions, while on the contrary promoting the formation of cracks in crystal ingots.

Since the cerium-doped silicate single crystal as claimed in the present invention facilitates increases in oxygen deficit density in the case of carrying out crystal growth or cooling in a neutral or reducing atmosphere having a low oxygen content or in a vacuum, the above-mentioned effects of the present invention are demonstrated more effectively. In addition, a single crystal of a compound represented by general formula (1) or (2) is able to more effectively demonstrate the effects of the present invention the higher the ratio in Ln of one or more types of elements selected from the group consisting of Dy, Ho, Er, Tm, Yb, Lu, Y and Sc, which have a large difference in ionic radius with cerium and have a smaller ionic radius than Tb, or the more the crystal structure becomes a C2/c crystal structure.

The following provides an explanation of the method for producing scintillator single crystal according to a preferred embodiment of the present invention. This method for producing scintillator single crystal comprises a raw material preparation step in which a raw material is prepared that contains one or more types of elements selected from the group consisting of group 2 elements as constituent elements, a growth step in which single crystals are grown from the prepared raw material, and a heating step in which single crystal ingots obtained by going through the growth step are subjected to heat treatment under predetermined conditions.

In the raw material preparation step, a raw material is prepared that is composed of a mixture in which a group 2 element is added to the constituent elements of the base crystal. The constituent elements of the base crystal are prepared in the form of oxides (single oxides or compound oxides) or salts such as carbonates (single salts or compound salts). They may in the form of, for example, a solid powder. The group 2 element is preferably added at 0.0002 to 0.1 wt % based on the total weight of the single crystal raw material. There are no limitations on the time when the group 2 element is added provided it is added prior to crystal growth. Accordingly, the group 2 element may be added when weighing the raw materials or it may be mixed in when filling the raw materials into the crucible. In addition, there are no particular limitations on the form of the group 2 element at the time of addition provided it is contained in the single crystal grown, and may be added to the raw material in the form of, for example, an oxide or carbonate.

The growth step further has a melting step in which a melt is obtained in which the prepared raw materials are put into a melted state based on a melting method, and a cooling solidification step in which a single crystal ingot is obtained by cooling and solidifying the melt.

The melting method of the aforementioned melting process step may be the Czochralski method. If this method is used, it is preferable to perform the melting process step and the cooling and solidifying process step using a crystal growth drawing apparatus 10 having the structure shown in FIG. 1.

FIG. 1 is a typical cross-sectional view illustrating one example of the basic structure of a growing apparatus for growing a single crystal in the present invention. The drawing apparatus 10 shown in FIG. 1 comprises a high-frequency induction heating furnace 14. The high-frequency induction heating furnace 14 is one for performing operations in the aforementioned melting process step, and the cooling and solidifying process step sequentially.

In this high-frequency induction heating furnace 14 the refractory side walls form a cylindrical vessel with a bottom, and the shape per se of the cylindrical vessel with a bottom is similar to that used in single crystal growth based on the publicly known Czochralski method. A high frequency induction coil 15 is wrapped around the walls at the bottom of the high frequency induction furnace 14. In addition, a crucible 17 (for example, a crucible made of iridium) is arranged on the bottom within the high frequency induction furnace 14. This crucible 17 also serves as the high frequency induction thermal heater. In addition, when the single crystal starting material is placed into the crucible 17 and high frequency induction is applied to the high frequency induction coil 15, the crucible 17 is heated and a melt 18 comprising the constituent materials of the single crystal is obtained.

Moreover, a heater 13 (resistance thermal heater) is additionally positioned on the upper part of the inner wall surface such that does not come in contact with the melt 18 of the high frequency induction furnace 14. The thermal output of this heater can be controlled independently of the high frequency induction coil 15.

Furthermore, in the center of the bottom of the high frequency induction furnace 14 an opening (not illustrated) is provided that passes through to the exterior from the interior of the high frequency induction furnace 14. A crucible support rod 16 is inserted through this opening from the exterior of the high frequency induction furnace 14, and the tip of the crucible support rod 16 is in contact with the bottom of the crucible 17. By rotating this crucible support rod 16 it is possible to rotate the crucible 17 in the high frequency induction furnace 14. The space between the opening and the crucible support rod 16 is sealed with packing and the like.

Next the specific manufacturing method using the drawing apparatus 10 will be explained.

First, in the melting process step the single crystal starting material is placed in the crucible 17, and the molten liquid 18 (melt) comprising the single crystal constituent materials is obtained by applying high frequency induction to the high frequency induction coil 15. Examples of single crystal starting material include, for example, single oxides and/or complex oxides of metal elements that constitute the single crystal. Ultrapure products from Shin-Etsu Chemical Company, Ltd., Stanford Material Corporation, Tama Chemicals Company, Ltd. and the like are preferred as commercial products.

Next, in the cooling and solidifying process step a cylindrical single crystal ingot 1 is obtained by cooling and solidifying the molten liquid. More specifically, the operation is divided into two process steps, a crystal growing step and a cooling step that are described below.

First in the crystal growing step a pulling shaft 12 having a seed crystal 2 attached to the tip thereof is lowered into the molten liquid 18 from the top of the high frequency induction furnace 14. Next, the single crystal ingot 1 is formed by withdrawing the pulling shaft 12. At this time the heating output of the heater 13 is adjusted during the crystal growing step so that the single crystal ingot 1 pulled from the molten liquid 18 is grown until a cross-section thereof reaches a predetermined diameter.

Next, in the cooling step the thermal output of the heater is adjusted so that the grown single crystal ingot (not illustrated) obtained after the crystal growing step will cool.

Next, in the heating step, heat treatment is carried out under predetermined conditions on the cerium-doped orthosilicate single crystal ingots as claimed in the present invention obtained by going through the growth step. This heat treatment may be the heat treatment described in the specification of Japanese Patent Application No. 2005-253885 or Japanese Patent Application No. 2005-251886. More specifically, the single crystals may be heat treated in an oxygen-containing atmosphere (for example, an atmosphere having an oxygen concentration of 100 vol %, or an atmosphere having an oxygen concentration of 1 vol % or more to less than 100 vol % and containing nitrogen or an inert gas) at a heating temperature of, for example, 300 to 1500° C., preferably 500 to 1500° C. and more preferably 700 to 1300° C. In addition, the single crystals may be further heated at a heating temperature $T_a$ (unit: ° C.) that satisfies the condition represented by the following formula (5):

$$500 \leq T_a < (T_m - 550) \tag{5}$$

(wherein, $T_m$ (unit: ° C.) represents the melting point of the single crystals) by replacing the atmosphere with an atmosphere having a lower oxygen content while maintaining the heating temperature and then raising the temperature.

In addition, the cerium-doped orthosilicate single crystal as claimed in the present invention may be heated at a heating temperature $T_b$ (unit: ° C.) that satisfies the condition represented by the following formula (6):

$$800 \leq T_b < (T_m - 550) \tag{6}$$

(wherein, $T_m$ (unit: ° C.) represents the melting point of the single crystals) in an atmosphere having a low oxygen content (for example, an atmosphere in which the total concentration of argon and nitrogen is 80 vol % or more, and the oxygen concentration is less than 0.2 vol %, and when necessary, the concentration of hydrogen gas is 0.5 vol % or more), and then further heated by replacing the atmosphere with the above-mentioned oxygen-containing atmosphere and heating at a heating temperature of 300 to 1500° C. in that atmosphere.

The oxygen deficits formed in the single crystal can be further reduced by carrying out this heat treatment.

In addition, ingots of the cerium-doped orthosilicate single crystal as claimed in the present invention obtained by going through the growth step may be heated at a temperature $T_3$ (unit: ° C.) that satisfies the condition represented by the following formula (7):

$$800 \leq T_3 < (T_{m3} - 550) \tag{7}$$

(wherein, $T_{m3}$ (unit: ° C.) represents the melting point of the single crystals) in an atmosphere having a low oxygen content (for example, an atmosphere in which the total concentration of argon and nitrogen is 80 vol % or more, and the oxygen concentration is less than 0.2 vol %, and when necessary, the concentration of hydrogen gas is 0.5 vol % or more). Simultaneous to inhibiting increases in oxygen deficits in the crystals, $Ce^{4+}$ can be more efficiently changed to $C^{3+}$ by carrying out this heat treatment.

Furthermore, the above-mentioned heating step may be omitted from the production method for scintillator single crystal of the present invention.

The present invention relates to a single crystal, and production method thereof, which improves the light output, background of the light output, energy resolution and other scintillator properties of the cerium-doped silicate single crystal. The valence status of the cerium ion in a cerium-doped orthosilicate single crystal has a considerable influence on light output. A change from the primary emission state of the trivalent cerium ion to the non-emission state of the tetravalent cerium ion in which coloring and absorption of fluorescence occur occurs due to heating in an oxygen-containing atmosphere. Consequently, growth of single crystals is carried out in a neutral or reducing atmosphere having a low oxygen content or in a vacuum. However, oxygen deficits form in the single crystal as a result of single crystal growth under such conditions. Oxygen deficits formed in single crystal have an influence on the background intensity of the light output. These oxygen deficits cause increases in variations in fluorescence within crystal ingots and between ingots, daily differences and changes over time when irradiated by visible light containing ultraviolet rays. These oxygen deficits are believed to be caused by crystal growth and/or cooling in an atmosphere at a high temperature comparatively close to the melting temperature of the crystal and having a low oxygen content, or by heat treatment. The inventors of the present invention found that by containing an element that exists as a stable oxide in a crystal even in an atmosphere at a high temperature close to the growth conditions of the single crystal and having a low oxygen content, the effects of oxygen deficits can be inhibited and light output properties can be improved, thereby leading to completion of the present invention on the basis thereof.

EXAMPLES

The present invention is described in greater detail below through examples, but the present invention is by no means limited to these examples.

Example 1

Single crystal was produced based on the Czochralski method. First, using $Gd_{2-(r+s)}Lu_rCe_sSiO_5$ (r=1.8, s=0.003) single crystals for the raw material, 500 g of a mixture of gadolinium oxide ($Gd_2O_3$, purity: 99.99 wt %), ruthenium oxide ($Lu_2O_3$, purity: 99.99 wt %), silicon oxide ($SiO_2$, purity: 99.9999 wt %) and cerium oxide ($CeO_2$, purity: 99.99 wt %), mixed to form a predetermined stoichiometric composition, and 0.01774 g of magnesium oxide (MgO, purity: 99.99 wt %) (equivalent to 0.0035 wt % as Mg) were prepared and charged into a crucible made of Ir having a diameter of 50 mm, height of 50 mm and thickness of 2 mm. Next, a melt was obtained by heating to the melting point (about 2050° C.) in a high-frequency induction heating furnace and melting. Furthermore, the melting point was measured using an electronic optical pyrometer (Chino, Pyrostar Model UR-U, trade name).

Next, the tip of the pulling shaft having a seed crystal attached thereto was lowered into the melt and seeding was performed. Next, the neck section was formed by pulling the single crystal ingot at a pull rate of 1.5 mm/h. Thereafter, pulling of the cone section was performed, and when a diameter of 25 mm was reached, pulling of the body was initiated at a pull rate of 1 nm/h. After the body had been grown, the single crystal ingot was freed from the melt and cooling was initiated.

During crystal growth nitrogen gas with a flow rate of 4 L/min was streamed continuously within the growth furnace. The oxygen concentration in the furnace at that time was measured by a zirconia sensor (Tohken Co., Ltd., ECOAZ-CG® $O_2$ ANALYZER), and it was confirmed that the oxygen concentration was 50 vol ppm or lower.

After cooling was completed the single crystal obtained thereby was removed from the furnace. The single crystal ingot weighed approximately 250 g, the length of the cone section was approximately 30 mm, and the length of the body section was approximately 70 mm.

A plurality of rectangular crystal samples measuring 4 mm×6 mm×20 mm were cut from the single crystal ingot obtained thereby. Chemical etching was performed on the crystal samples with phosphoric acid, and the entire surface of the sample crystals was given a mirror finish. Then two mirror-polished crystal samples were selected arbitrarily from the plurality of crystal samples.

One of the 4 mm×6 mm surfaces (hereinafter, referred to as the "radiation incident surface") the among the 6 surfaces on the 4 mm×6 mm×20 mm rectangular crystal samples was excluded, and the remaining 5 surfaces were coated with polytetrafluoroethylene (PTFE) tape as a reflective material. Next, the aforementioned radiation incident surface of each sample, which was not coated with the PTFE tape, was immobilized on the photomultiplying plane (photoelectric conversion plane) in a photomultiplier tube (Hamamatsu Photonics, R878) using optical grease. Then, the light output, energy resolution and background of each sample was evaluated by irradiating each sample with gamma radiation of 662 KeV using $^{137}Cs$ and measuring the energy spectrum of each sample. The energy spectrum was measured when a voltage of 1.45 kV was applied to the photomultiplier tube, the signal from the dynode was amplified by a preamplifier (ORTEC® Model 113) and a waveform shaping amplifier (ORTEC® Model 570), and measured with a multichannel analyzer (MCA) (PGT, Quantum MCA4000®).

In addition, cracking of the crystal ingots was evaluated by visual examination. Cracking consisting of two or less independent (non-continuous) cracks and the length in the lengthwise direction of the ingot of the portion free of cracks running in the direction of ingot diameter was greater than or equal to 70% of the total length of the ingot was evaluated as "low". On the other hand, cracking consisting of three or more independent (non-continuous) cracks or the length in the lengthwise direction of the ingot of the portion free of cracks running in the direction of ingot diameter was less than 70% of the total length of the ingot was evaluated as "high". Those results are shown in Table 1.

TABLE 1

| | Crystal composition | Added elements/ concentration (wt %) | Atmosphere | Light output (ch) | Energy resolution (%) | Background (mV) | Crystal ingot cracking |
|---|---|---|---|---|---|---|---|
| Ex. 1 | $Gd_{2-(r+s)}Lu_rCe_sSiO_5$ (r = 1.8, s = 0.003) | MgO/0.0035 Mg/0.0021 | Nitrogen growth | 1300.8 1321.0 | 9.8 9.5 | 0 0 | Low |
| Ex. 2 | | $CaCO_3$/0.0088 Ca/0.0035 | | 1373.5 1335.3 | 10.3 11.2 | 0 0 | Low |
| Ex. 3 | $Y_{2-(x+y)}Lu_xCe_ySiO_5$ (x = 1.8, y = 0.003) | MgO/0.0035 Mg/0.0021 | | 1358.1 1321.2 | 9.6 9.7 | 0 0 | Low |
| Ex. 4 | $Gd_{2-(r+s)}Lu_rCe_sSiO_5$ (r = 1.8, s = 0.003) | MgO/0.00089 Mg/0.0005 | | 1150.5 1205.6 | 10.5 10.3 | 0 0 | Low |
| Ex. 5 | | MgO/0.0035 Mg/0.0021 | Nitrogen growth → heating in air | 1380.2 1403.2 | 9.7 9.5 | 0 0 | Low |
| Ex. 6 | | MgO/0.00071 Mg/0.0043 | Nitrogen growth | 1311.5 1275.3 | 9.8 10.5 | 0 0 | Low |
| Ex. 7 | | $CaCO_3$/0.0088 Ca/0.0035 | Nitrogen + trace oxygen growth | 1390.8 1411.8 | 8.5 8.4 | 0 0 | Low |
| Ex. 8 | | $CaCO_3$/0.0176 Ca/0.0070 | | 1420.5 1450.8 | 8.7 8.4 | 0 0 | Low |
| Ex. 9 | $Gd_{2-(r+s)}Lu_rCe_sSiO_5$ (r = 0.4, s = 0.02) | $CaCO_3$/0.0088 Ca/0.0035 | Nitrogen growth | 588.5 600.8 | 9.0 8.4 | 0 0 | High |
| Ex. 10 | | | Nitrogen + trace oxygen growth | 578.5 574.3 | 8.6 8.4 | 0 0 | High |

TABLE 2

| | Crystal composition | Added elements/ concentration (wt %) | Atmosphere | Light output (ch) | Energy resolution (%) | Background (mV) | Crystal ingot cracking |
|---|---|---|---|---|---|---|---|
| Comp. Ex. 1 | $Gd_{2-(r+s)}Lu_rCe_sSiO_5$ (r = 1.8, s = 0.003) | None | Nitrogen growth | 730.2 Immeasurable | 9.8 Immeasurable | 20 50 | Low |
| Comp. Ex. 2 | | MgO/0.000035 Mg/0.00002 | | 820.6 Immeasurable | 10.3 Immeasurable | 10 30 | Low |
| Comp. Ex. 3 | | $SrCO_3$/0.13 Sr/0.0077 | | Extremely numerous crystal cracks (evaluation sample unable to be collected) | | | |
| Comp. Ex. 4 | | $Ta_2O_5$/0.049 Ta/0.004 | | 650.5 785.0 | 12.1 11.8 | 20 20 | High |
| Comp. Ex. 5 | | $WO_3$/0.044 W/0.035 | | 515.3 385.5 | 14.5 17.8 | 10 10 | High |
| Comp. Ex. 6 | | None | Nitrogen + trace oxygen growth | 488.5 415.8 | 15.5 17.5 | 10 10 | Low |
| Comp. Ex. 7 | $Gd_{2-(r+s)}Lu_rCe_sSiO_5$ (r = 0.4, s = 0.02) | | Nitrogen growth | 578.1 553.4 | 9.8 10.8 | 10 30 | High |

Example 2

Example 2 was carried out in the same manner as Example 1 with the exception of substituting 0.0441 g of calcium carbonate ($CaCO_3$, purity: 99.99 wt %) (equivalent to 0.0088 wt % as Ca) for the 0.01774 g of magnesium oxide (MgO, purity: 99.99 wt %).

Example 3

Example 3 was carried out in the same manner as Example 1 with the exception of substituting $Y_{2-(x+y)}Lu_xCe_ySiO_5$ (x=1.8, y=0.003) for $Gd_{2-(r+s)}Lu_rCe_sSiO_5$ (r=1.8, s=0.003), and substituting yttrium oxide ($Y_2O_3$, purity: 99.99 wt %) for gadolinium oxide ($Gd_2O_3$, purity: 99.99 wt %).

Example 4

Example 4 was carried out in the same manner as Example 1 with the exception of substituting 0.00443 g of magnesium oxide (MgO, purity: 99.99 wt %) (equivalent to 0.00089 wt % as Mg) for 0.01774 g of magnesium oxide (MgO, purity: 99.99 wt %).

Example 5

Example 5 was carried out in the same manner as Example 1 up to and including the cutting out of a plurality of rectangular crystal samples measuring 4 mm×6 mm×20 mm from the resulting single crystal ingots. Two crystal samples were randomly sampled from the resulting crystal samples, placed on a platinum plate and loaded into an electric furnace. Next, after raising the temperature in the electric furnace over the course of about 4 hours and holding at a temperature of 1200° C. for 12 hours in air, the samples were cooled to room temperature over the course of about 10 hours. The remainder of the procedure starting with chemical etching was the same as Example 1.

Example 6

Example 6 was carried out in the same manner as Example 1 with the exception of substituting 0.03549 g of magnesium oxide (MgO, purity: 99.99 wt %) (equivalent to 0.0071 wt % as Mg) for 0.01774 g of magnesium oxide (MgO, purity: 99.99 wt %).

Example 7

Example 7 was carried out in the same manner as Example 2 with the exception of allowing $O_2$ gas to flow into the growth furnace during crystal growth at a flow rate of 10 mL/min in addition to the $N_2$ gas at a flow rate of 4 L/min.

Example 8

Example 8 was carried out in the same manner as Example 7 with the exception of substituting 0.0881 g of calcium carbonate ($CaCO_3$, purity: 99.99 wt %) (equivalent to 0.0176 wt % as Ca) for 0.0441 g of calcium carbonate ($CaCO_3$, purity: 99.99 wt %).

Example 9

Example 9 was carried out in the same manner as Example 2 with the exception of substituting $Gd_{2-(r+s)}Lu_rCe_sSiO_5$ (r=0.4, s=0.02) for $Gd_{2-(r+s)}Lu_rCe_sSiO_5$ (r=1.8, s=0.003), and changing the heating temperature in the high-frequency induction heating furnace from about 2050° C. to the melting point of $Gd_{2-(r+s)}Lu_rCe_sSiO_5$ (r=0.4, s=0.02) (about 1980° C.).

Example 10

Example 10 was carried out in the same manner as Example 9 with the exception of allowing $O_2$ gas to flow into the growth furnace during crystal growth at a flow rate of 10 mL/min in addition to the $N_2$ gas at a flow rate of 4 L/min.

Comparative Example 1

Comparative Example 1 was carried out in the same manner as Example 1 with the exception of not using magnesium oxide.

Comparative Example 2

Comparative Example 2 was carried out in the same manner as Example 1 with the exception of substituting 0.00018 g of magnesium oxide (MgO, purity: 99.99 wt %) (equivalent to 0.000035 wt % as Mg) for 0.01774 g of magnesium oxide (MgO, purity: 99.99 wt %).

Comparative Example 3

Comparative Example 3 was carried out in the same manner as Example 1 with the exception of substituting 0.6507 g of strontium carbonate ($SrCO_3$, purity: 99.99 wt %) (equivalent to 0.130 wt % as Sr) for 0.01774 g of magnesium oxide (MgO, purity: 99.99 wt %). Since a portion of the resulting single crystals had formed polycrystals at the portion between the cone and cylindrical portion (shoulder) and numerous cracks had formed, rectangular samples were unable to be cut out.

Comparative Example 4

Comparative Example 4 was carried out in the same manner as Example 1 with the exception of substituting 0.2431 g of tantalum oxide ($Ta_2O_5$, purity: 99.99 wt %) (equivalent to 0.0486 wt % as Ta) for 0.01774 g of magnesium oxide (MgO, purity: 99.99 wt %).

Comparative Example 5

Comparative Example 5 was carried out in the same manner as Example 7 with the exception of substituting 0.2195 g of tungsten oxide ($WO_3$, purity: 99.99 wt %) (equivalent to 0.0439 wt % as W) for 0.0441 g of calcium carbonate ($CaCO_3$, purity: 99.99 wt %).

Comparative Example 6

Comparative Example 6 was carried out in the same manner as Comparative Example 1 with the exception of allowing $O_2$ gas to flow into the growth furnace during crystal growth at a flow rate of 10 mL/min in addition to the $N_2$ gas at a flow rate of 4 L/min.

Comparative Example 7

Comparative Example 7 was carried out in the same manner as Example 9 with the exception of not using calcium carbonate.

The results for the light output, energy resolution and background of the crystal samples as claimed in Examples 2 to 10 and Comparative Examples 1 to 7 are shown in Tables 1 and 2 in the same manner as Example 1. Furthermore, those samples indicated as "immeasurable" in Table 2 refer to those samples for which light output and energy resolution were unable to be measured accurately due to high background.

The crystals used in Examples 1 to 4 and 6 were obtained by adding predetermined amounts of group 2 elements that form stable oxides at low oxygen concentrations at 2000° C. in the vicinity of the crystal growth conditions. As a result, these single crystals demonstrated decreased light output background and improved light output despite having been grown in a nitrogen atmosphere. Among these examples, the concentration of the group 2 element was lower in Example 4 than in the other examples (Examples 1 to 3 and 6). Consequently, the effects of lowering background and improving light output were smaller than in those examples.

In Example 5, fluorescent properties were further improved by carrying out heat treatment on the crystal sample following the processing of Example 1. This is thought to be the result of oxygen deficits formed during crystal growth having been reduced in single crystals to which a group 2 element was added as claimed in the present invention. In addition, fluorescent properties were thought to have been improved as a result of oxygen deficits being further reduced by heat treatment in air.

Examples 7 and 8 relate to crystals obtained by adding predetermined amounts of group 2 elements that form stable oxides at low oxygen concentrations at 2000° C. in the vicinity of the crystal growth conditions. These single crystals allowed the obtaining of high light output and good fluorescent properties with low background despite having been grown in an atmosphere containing oxygen. This is thought to be the result of the following action. Namely, in crystals to which a predetermined amount of a group 2 element has been added, changes in the valence of the Ce ions are inhibited even in an atmosphere containing oxygen. Consequently, the occurrence of oxygen deficits is inhibited and decreases in light output caused by changes in the valence of the Ce ions are prevented.

Examples 9 and 10 relate to single crystals having a low Lu concentration in the crystal structures thereof. In Example 9, light output and background properties are improved as a result of adding a predetermined amount of a group 2 element that forms a stable oxide at low oxygen concentrations at 2000° C. in the vicinity of the crystal growth conditions. In Example 10, fluorescent properties similar to those of Example 9 are obtained even though the crystal were grown in an atmosphere containing oxygen. This is thought to be the result of the following action. Namely, in crystals to which a predetermined amount of a group 2 element has been added, changes in the valence of the Ce ions are inhibited even in an atmosphere containing oxygen. Consequently, the occurrence of oxygen deficits is inhibited and decreases in light output caused by changes in the valence of the Ce ions are prevented. Furthermore, since the crystal structure tends to be somewhat unstable in single crystals having a low Lu concentration, cracking of the crystal ingots increased. Accordingly, the cracking of the crystal ingots was not an effect of the addition of the group 2 element.

In Comparative Example 1, background increased and variations in fluorescent properties increased. This is thought to have been caused by the introduction of oxygen deficits during crystal growth as a result of not having added a group 2 element to the single crystals. In addition, although the single crystals of Comparative Example 2 contained a group 2 element, since the amount added thereof was too low, the predetermined effects were unable to be obtained. Although the single crystals of Comparative Example 3 also contained a group 2 element, since the amount added thereof was too high, the single crystal strain increased and the single crystal growth were difficult, and then the predetermined effects were unable to be obtained.

Comparative Examples 4 and 5 relate to single crystals to which pentavalent and hexavalent elements were added. These single crystals were unable to adequately decrease background due to the diminished effect of reducing the effects of oxygen deficits. In addition, although crystal growth was carried out in an atmosphere containing oxygen in Comparative Example 5, light output was thought to have decreased as a result of being unable to adequately inhibit changes in the valence of the Ce ions.

In Comparative Example 6, background caused by the formation of oxygen deficits was somewhat low since the single crystals were grown in an atmosphere containing oxygen. However, since an element was not added to the base crystal, the valence of the Ce ions became tetravalent resulting in a decrease in light output.

Comparative Example 7 relates to single crystals having a low Lu concentration in the crystal structure thereof. Since a group 2 element was not added to these single crystals, background increased due to the introduction of oxygen deficits during crystal growth. Since light output and oxygen deficits are dependent on the composite ratio of Lu, light output was lower than Comparative Example 1 having a high Lu concentration. However, the background was lower due to the difficulty of forming oxygen deficits. Since the crystal structure tends to be somewhat unstable in single crystals having a low Lu concentration, there was a high degree of cracking of the crystal ingots even if an element was not added to the base crystal.

What is claimed is:

1. A scintillator single crystal of a cerium-doped silicate compound represented by the following general formula (1) or (2) that contains 0.00005 to 0.1 wt % of Ca based on the total weight of the single crystal:

$$Y_{2-(x+y)}Ln_xCe_ySiO_5 \tag{1}$$

(wherein, Ln represents at least one type of element selected from the group consisting of elements belonging to the rare earth elements, x represents a numerical value of 0 to 2, and y represents a numerical value of greater than 0 but less than or equal to 0.2);

$$Gd_{2-(z+w)}Ln_zCe_wSiO_5 \tag{2}$$

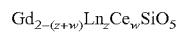

(wherein, Ln represents at least one type of element selected from the group consisting of elements belonging to the rare earth elements, z represents a numerical value of greater than 0 but less than or equal to 2, and w represents a numerical value of greater than 0 but less than or equal to 0.2).

2. A scintillator single crystal of a cerium-doped silicate compound represented by the following general formula (3) that contains 0.00005 to 0.1 wt % of Ca based on the total weight of the single crystal:

$$Gd_{2-(p+q)}Ln_pCe_qSiO_5 \tag{3}$$

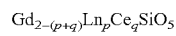

(wherein, Ln represents at least one type of element selected from the group consisting of the rare earth elements of Dy, Ho, Er, Tm, Yb, Lu, Y and Sc having a smaller ionic radius than Tb, p represents a numerical value of greater than 0 but less than or equal to 2, and q represents a numerical value of greater than 0 but less than or equal to 0.2).

3. A scintillator single crystal of a cerium-doped silicate compound represented by the following general formula (4) that contains 0.00005 to 0.1 wt % of Ca based on the total weight of the single crystal:

$$Gd_{2-(r+s)}Lu_rCe_sSiO_5 \tag{4}$$

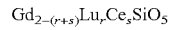

(wherein, r represents a numerical value of greater than 0 but less than or equal to 2, and s represents a numerical value of greater than 0 but less than or equal to 0.2).

4. A method for producing the scintillator single crystal according to any of claims 1 to 3, comprising a step of preparing a raw material that contains Ca as a constituent element.

* * * * *